(12) United States Patent
Yan et al.

(10) Patent No.: US 12,363,848 B2
(45) Date of Patent: Jul. 15, 2025

(54) ISOLATOR AND ITS ELECTRONIC SUBASSEMBLY

(71) Applicant: EZCONN CORPORATION, New Taipei (TW)

(72) Inventors: Li Chan Yan, New Taipei (TW); Ming-Ching Chen, New Taipel (TW)

(73) Assignee: EZCONN CORPORATION, New Taipei (TW)

( * ) Notice: Subject to any disclaimer, the term of this patent is extended or adjusted under 35 U.S.C. 154(b) by 378 days.

(21) Appl. No.: 18/066,957

(22) Filed: Dec. 15, 2022

(65) Prior Publication Data

US 2023/0187800 A1 Jun. 15, 2023

(30) Foreign Application Priority Data

Dec. 15, 2021 (AU) ................................ 2021904074

(51) Int. Cl.
*H01P 1/20* (2006.01)
*H03H 1/00* (2006.01)
*H05K 1/02* (2006.01)
*H05K 7/14* (2006.01)

(52) U.S. Cl.
CPC ............. *H05K 7/1427* (2013.01); *H01P 1/20* (2013.01); *H03H 1/0007* (2013.01); *H05K 1/0277* (2013.01)

(58) Field of Classification Search
CPC ........... H01P 1/36; H01P 1/20; H05K 1/0277; H05K 7/1427; H05K 9/006; H05K 1/0233; H01R 24/38; H04H 20/76; H04N 7/104; H03H 1/0007; H04B 3/28
USPC ........................... 333/12; 361/117, 118, 119
See application file for complete search history.

(56) References Cited

U.S. PATENT DOCUMENTS 5,150,087 A * 9/1992 Yoshie ................. H05K 9/0066
333/167

* cited by examiner

*Primary Examiner* — Stephen E. Jones
(74) *Attorney, Agent, or Firm* — RANKIN, HILL & CLARK LLP

(57) ABSTRACT

Some embodiments of the disclosure provide an isolator which includes a body, a first circuit module, and a second circuit module. In some examples, the first circuit module is arranged at a first connecting port of the body and includes a first integrated circuit board, a first shell surrounding the first integrated circuit board, a first signal processing circuit penetrating through the first integrated circuit board, and a joint sleeved on an insulating bushing. The joint partially surrounds the first signal processing circuit. A first end portion of the first signal processing circuit is electrically connected to a first contact element. The second circuit module is arranged at a second connecting port of the body and includes a second integrated circuit board, a second shell surrounding the second integrated circuit board, and a second signal processing circuit extending along a length direction of the second integrated circuit board.

17 Claims, 15 Drawing Sheets

ISOLATOR AND ITS ELECTRONIC SUBASSEMBLY

CROSS REFERENCE TO RELATED APPLICATIONS

This application claims priority to Australian Provisional Patent Application Number 2021904074, filed on Dec. 15, 2021, the disclosure of which is incorporated by reference herein in its entirety.

FIELD OF THE DISCLOSURE

The disclosure relates generally to the field of signal isolation. More specifically, the disclosure relates to a signal isolation device and subassembly thereof.

BACKGROUND

As shown in FIGS. 1 to 2, the conventional signal isolator 9 is used to transmit and switch the cable TV signal (radio frequency signal) from the system end to the user end. The signal isolator 9 has a housing 90, an input port 91, and an output port 92, the input port 91 and the output port 92 are all penetrated through the housing 90. The radio frequency signal is input through the input port 91 and output through the output port 92 after being processed by the circuit module 93 inside the housing 90. The circuit module 93 includes a first circuit board 931, a second circuit board (not shown), and an isolation unit 94. The first circuit board 931 and the second circuit board are both located in the housing 90 and connected to the input port 91 and the output port 92, respectively. To achieve a better signal isolation effect, the internal space of the housing 90 is divided into an upper half 951 and a lower half 952 through a partition 95, thereby allowing the first circuit board 931 and the second circuit board to be arranged separately. The first circuit board 931 is electrically connected to the second circuit board by the wire (not shown), and the wire passes through the hole 953 of the partition 95. The isolation unit 94 is electrically connected to the first circuit board 931, the isolation unit 94 has a functional block for signal isolation, the functional block has a plurality of capacitors 941 and a plurality of inductors 942 which enable signal noise to be isolated. Although the conventional signal isolator 9 has the effect of isolating signal noise, it requires a larger housing space to accommodate the first circuit board 931, the second circuit board, and the isolation unit 94. The impedance matching of this isolator at high frequency fails to perform satisfactorily, which makes the loss of the high-frequency signal larger.

SUMMARY

The following presents a simplified summary of the invention in order to provide a basic understanding of some aspects of the invention. This summary is not an extensive overview of the invention. It is not intended to identify critical elements or to delineate the scope of the invention. Its sole purpose is to present some concepts of the invention in a simplified form as a prelude to the more detailed description that is presented elsewhere.

In some embodiments, the disclosure provides an isolator including a body, a first circuit module, and a second circuit module. The body includes a first connecting port, a second connecting port, and an insulating bushing arranged on the first connecting port.

The first circuit module includes a first integrated circuit board, a first shell surrounding the first integrated circuit board, a first signal processing circuit penetrating the first integrated circuit board, and a joint deposited on the insulating bushing. The first circuit module is arranged adjacent to the first connecting port, the joint partially surrounding the first signal processing circuit, and a first end portion of the first signal processing circuit being electrically connected to a first contact element.

The second circuit module includes a second integrated circuit board, a second shell surrounding the second integrated circuit board, and a second signal processing circuit extending along a length direction of the second integrated circuit board. The second circuit module is arranged adjacent to the second connecting port, the second signal processing circuit includes a first contact point and a second contact point, the first contact point of the second signal processing circuit is electrically connected to a second end portion of the first signal processing circuit, and the second contact point of the second signal processing circuit is electrically connected to a second contact element.

Optionally, the first circuit module further includes an insulating ring and a first iron core, the insulating ring is deposited between the first shell and the joint, the first iron core is sleeved on the insulating ring, and the first iron core surrounds the first signal processing circuit.

Optionally, the joint includes at least one extension part extending outward from an end edge thereof, at least one groove is formed on an outer peripheral surface of the insulating ring to accommodate the at least one extension part of the joint, the at least one extension part of the joint includes a first extension length in an axial direction, the at least one groove of the insulating ring includes a second extension length in the axial direction, and the first extension length is shorter than the second extension length.

Optionally, the first integrated circuit board includes at least one substrate, a plurality of capacitors, and a second iron core, the capacitors are electrically connected to the at least one substrate, the capacitors are located symmetrically on both sides of the first signal processing circuit, and the second iron core surrounds the first signal processing circuit.

Optionally, the second integrated circuit board includes a substrate and a lightning protection component, the second signal processing circuit is formed on the substrate, and the lightning protection component is electrically connected to the second contact element and the second signal processing circuit.

Optionally, the lightning protection component includes at least one item selected from the group consisting of a protecting tube, a choke, and a high-pass filter.

Optionally, the first circuit module further includes a coaxial cable, the first signal processing circuit is positioned inside the coaxial cable, the coaxial cable includes the first end portion and the second end portion, and the first end portion and the second end portion are oppositely arranged.

Optionally, the first circuit module further includes a flexible printed circuit board, the first signal processing circuit is positioned in the flexible printed circuit board, the flexible printed circuit board includes the first end portion and the second end portion, and the first end portion and the second end portion are oppositely arranged.

Optionally, the body is hollow and further includes a first ring wall extending inward from the first connecting port, the first ring wall is configured to accommodate the first circuit module, and the first ring wall connects to the first shell of the first circuit module.

Optionally, the first circuit module further includes an insulating sleeve, the joint of the first circuit module includes a head section and a tail section, a portion of an outer peripheral surface of head section contacts an inner surface of the insulating bushing, the insulating sleeve is sleeved on the tail section of the joint, and a shape of an outer surface of the insulating sleeve matches that of an inner peripheral surface of the first ring wall.

Optionally, the body is L-shaped and further includes a base wall and a vertical wall, and the first connecting port and the second connecting port are formed on the vertical wall.

Optionally, the body is sheet-shaped and further includes a vertical wall, a first ring wall, and a second ring wall. The first connecting port and the second connecting port are formed on the vertical wall, the first ring wall extends from the first connecting port, the second ring wall extends from the second connecting port, the first circuit module is arranged inside the first ring wall, and the second circuit module is arranged inside the second ring wall.

In other embodiments, the disclosure provides an electronic subassembly for mounting on a body, including a first circuit module, a second circuit module, and a connecting element. The body includes a first connecting port and a second connecting port.

The first circuit module includes a first integrated circuit board and a first shell surrounding the first integrated circuit board, the first circuit module is arranged adjacent to the first connecting port, and the first integrated circuit board includes a first functional block.

The second circuit module includes a second integrated circuit board and a second shell surrounding the second integrated circuit board, the second circuit module is arranged adjacent to the second connecting port, and the second integrated circuit board includes a second functional block.

The connecting element is electrically connected to the first integrated circuit board and the second integrated circuit board. A first contact element is located in the first connecting port to receive an electrical signal, the electrical signal passes through the first functional block of the first integrated circuit board, the connecting element, and the second functional block of the second integrated circuit board, and the electrical signal is then transmitted outward through a second contact element located in the second connecting port.

Optionally, the connecting element penetrates the first integrated circuit board, the connecting element includes a first signal processing circuit, the first signal processing circuit includes a first end portion electrically connecting to the first contact element, the second integrated circuit board includes a second signal processing circuit, the second signal processing circuit includes a first contact point and a second contact point, the first contact point of the second signal processing circuit is electrically connected to a second end portion of the first signal processing circuit, and the second contact point of the second signal processing circuit is electrically connected to the second contact element.

Optionally, the body further includes an insulating portion formed on an inner surface of the first connecting port, the first circuit module further includes a joint partially surrounding the first end portion of the connecting element, and the joint is insulated from the first connecting port of the body by the insulating portion.

Optionally, the body is hollow and further includes a first ring wall extending inward from the first connecting port, the first circuit module is deposited inside the first ring wall, the connecting element further includes a grounded circuit, the first shell of the first circuit module contacts the first ring wall, and a small diameter part of the joint, the grounded circuit of the connecting element, a ground terminal on the first integrated circuit board, the first shell, and the first ring wall are electrically connected.

Optionally, the connecting element is a coaxial cable.

In further embodiments, the disclosure provides an electronic subassembly for mounting on a body, including a first circuit module and a second circuit module. The body including a first connecting port and a second connecting port.

The first circuit module includes a first integrated circuit board and a connecting element, the first circuit module is arranged adjacent to the first connecting port, the connecting element penetrates the first integrated circuit board, and a first end portion of the connecting element is electrically connected to a first contact element.

The second circuit module includes a second integrated circuit board and a signal processing circuit. The second circuit module is arranged adjacent to the second connecting port, the signal processing circuit extends along a length direction of the second integrated circuit board, the signal processing circuit includes a first contact point and a second contact point, the first contact point of the signal processing circuit is electrically connected to a second end portion of the connecting element, and the second contact point of the signal processing circuit is electrically connected to the second end portion of the connecting element.

Optionally, the body further includes an insulating portion formed on an inner surface of the first connecting port, the first circuit module further includes a joint partially surrounding the connecting element, the joint is insulated from the first connecting port of the body by the insulating portion, and the connecting element of the first circuit module includes at least one item selected from the group consisting of a wire, a coaxial cable, and a flexible printed circuit board.

Optionally, the first circuit module further includes an insulating ring and a first iron core, the insulating ring is arranged on the joint, the first iron core is sleeved on the insulating ring, and the first iron core surrounds the first end portion of the connecting element.

BRIEF DESCRIPTION OF THE DRAWINGS

Illustrative embodiments of the present disclosure are described in detail below with reference to the attached drawing figures.

DETAILED DESCRIPTION

The following describes some non-limiting exemplary embodiments of the invention with reference to the accompanying drawings. The described embodiments are merely a part rather than all of the embodiments of the invention. All other embodiments obtained by a person of ordinary skill in the art based on the embodiments of the disclosure shall fall within the scope of the disclosure.

Figure 1:
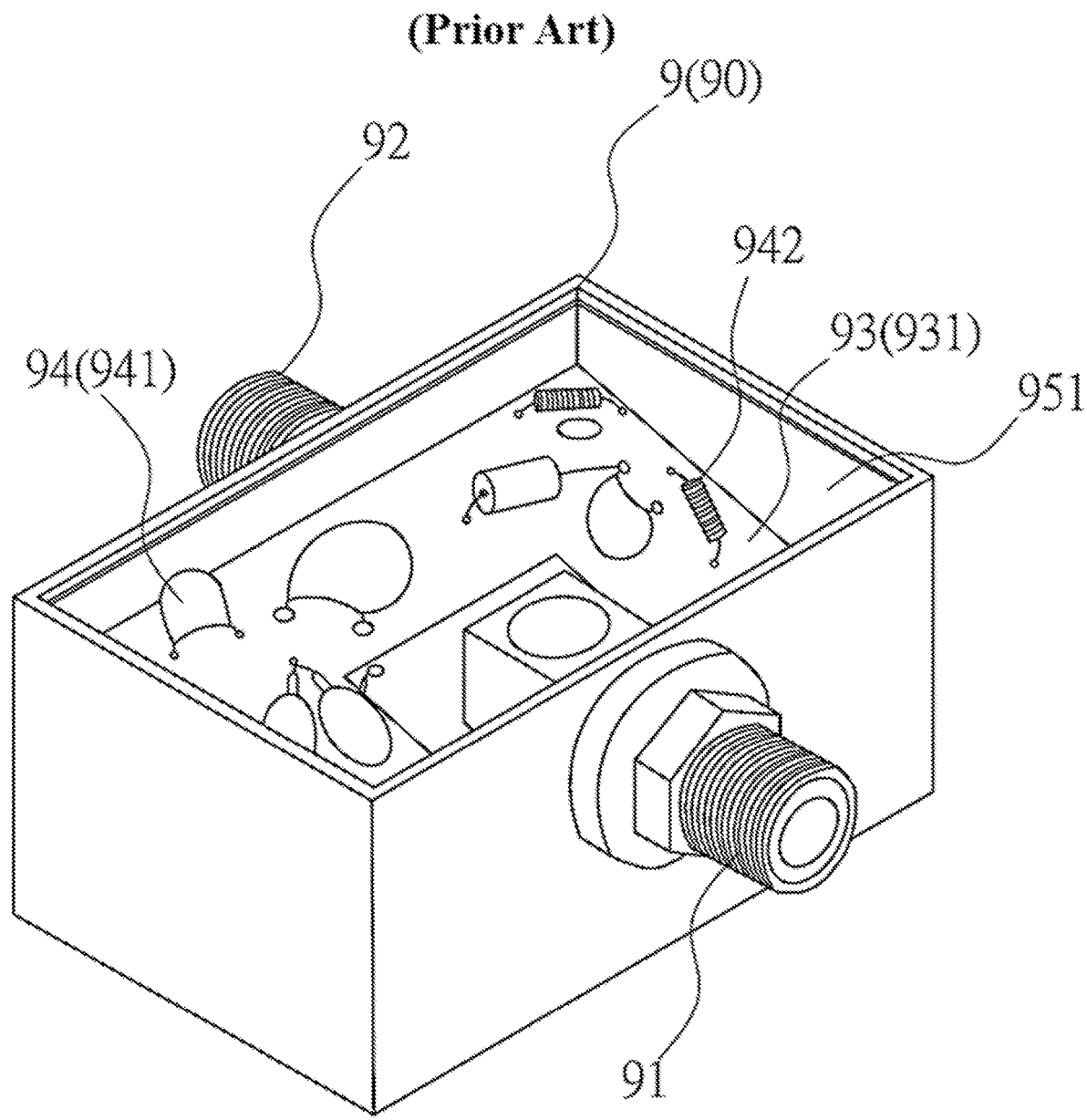
FIG. 1 illustrates a perspective view of a traditional isolator.
Figure 2:
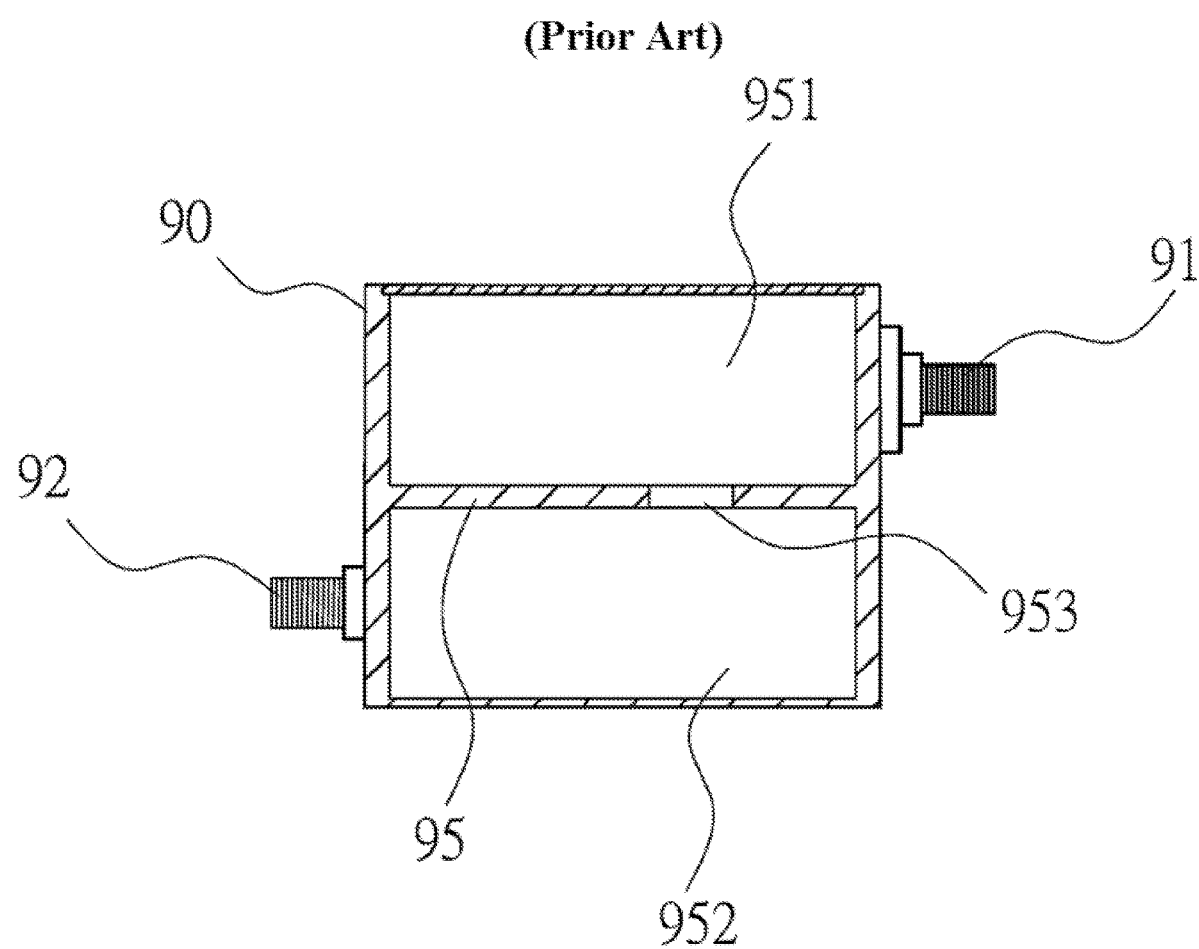
FIG. 2 illustrates a cross-sectional perspective view of a housing of the traditional isolator.
Figure 3:
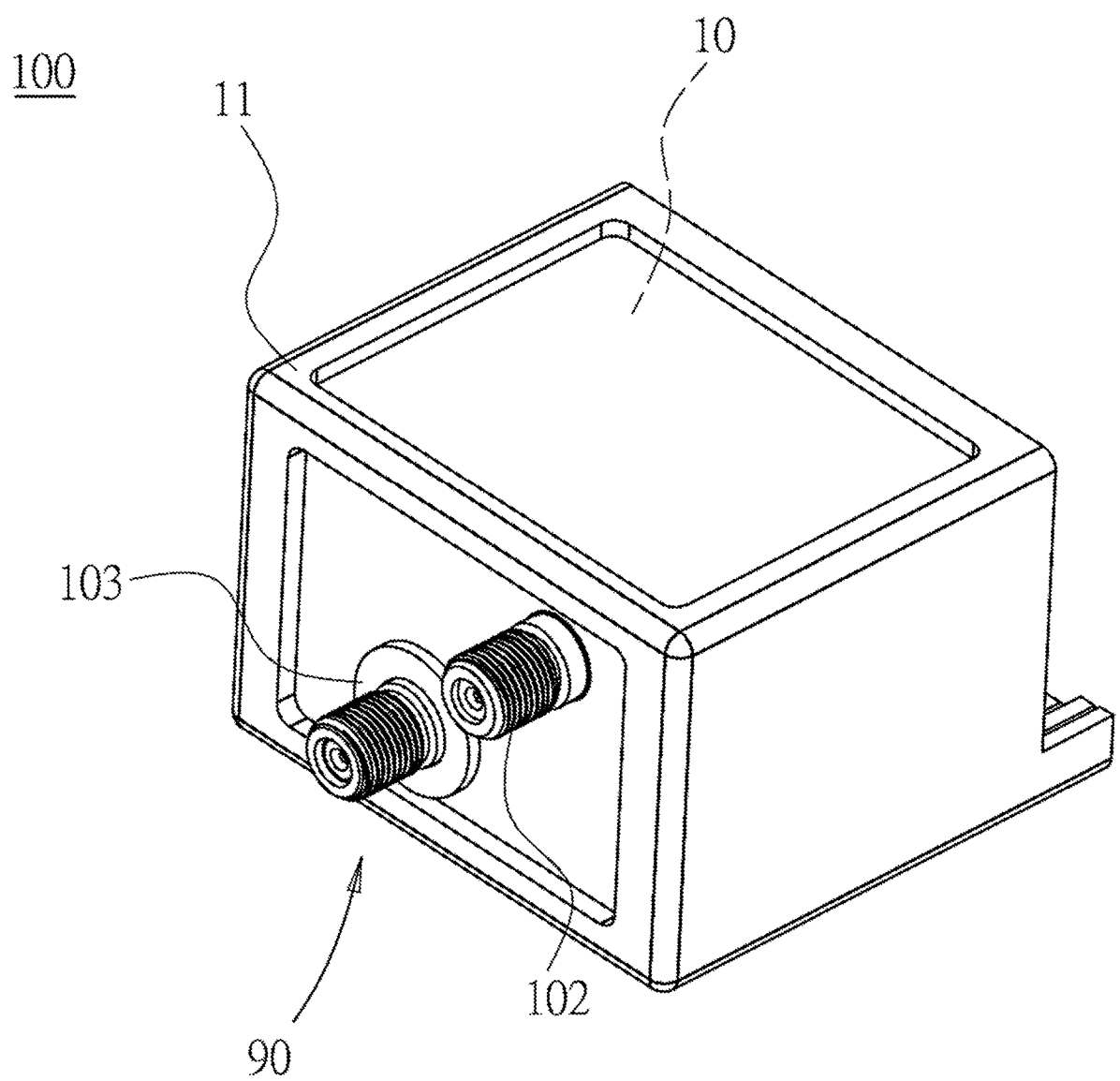
FIG. 3 illustrates a perspective view of a first embodiment of an isolator according to the present disclosure.
Figure 4:
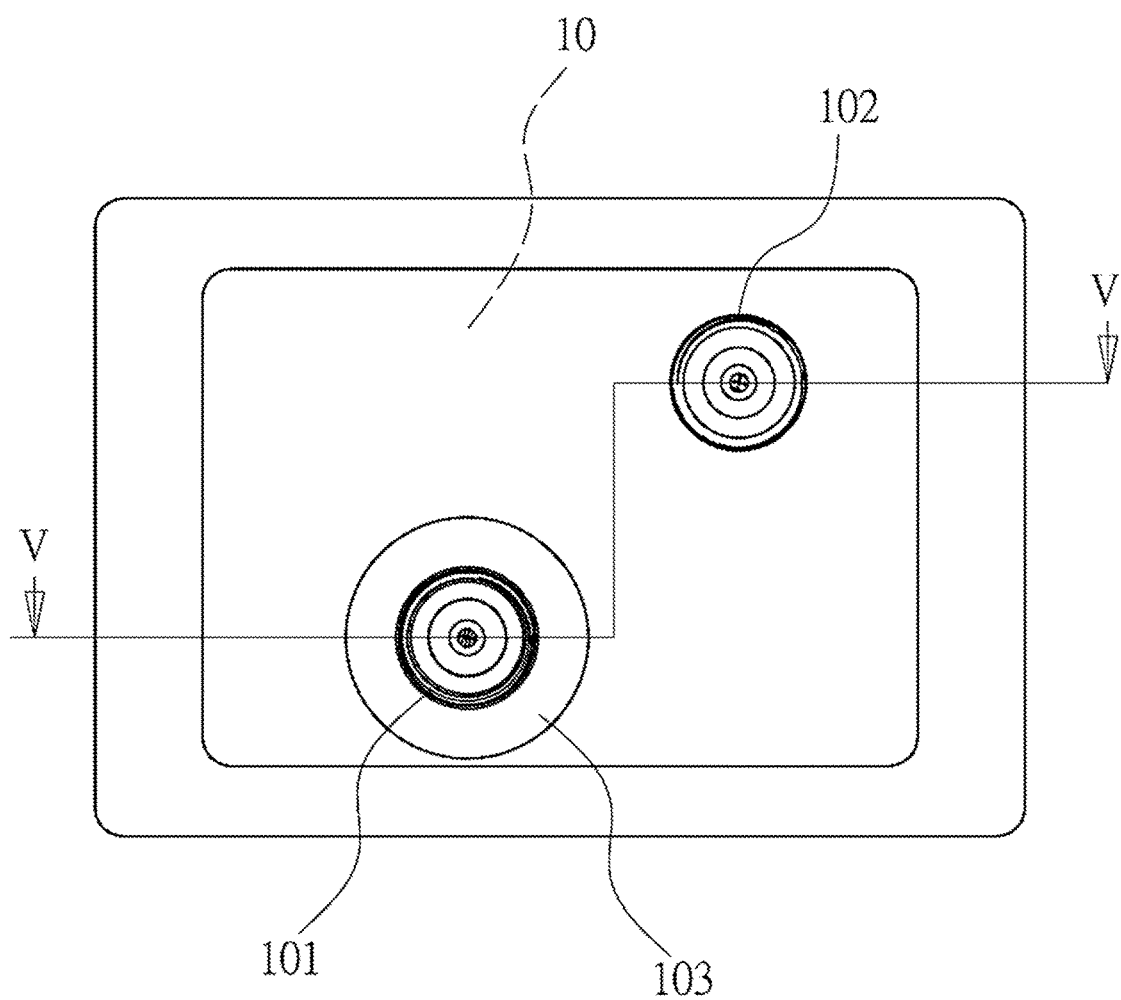
FIG. 4 illustrates a front-side view of the first embodiment of the isolator.
Figure 5:
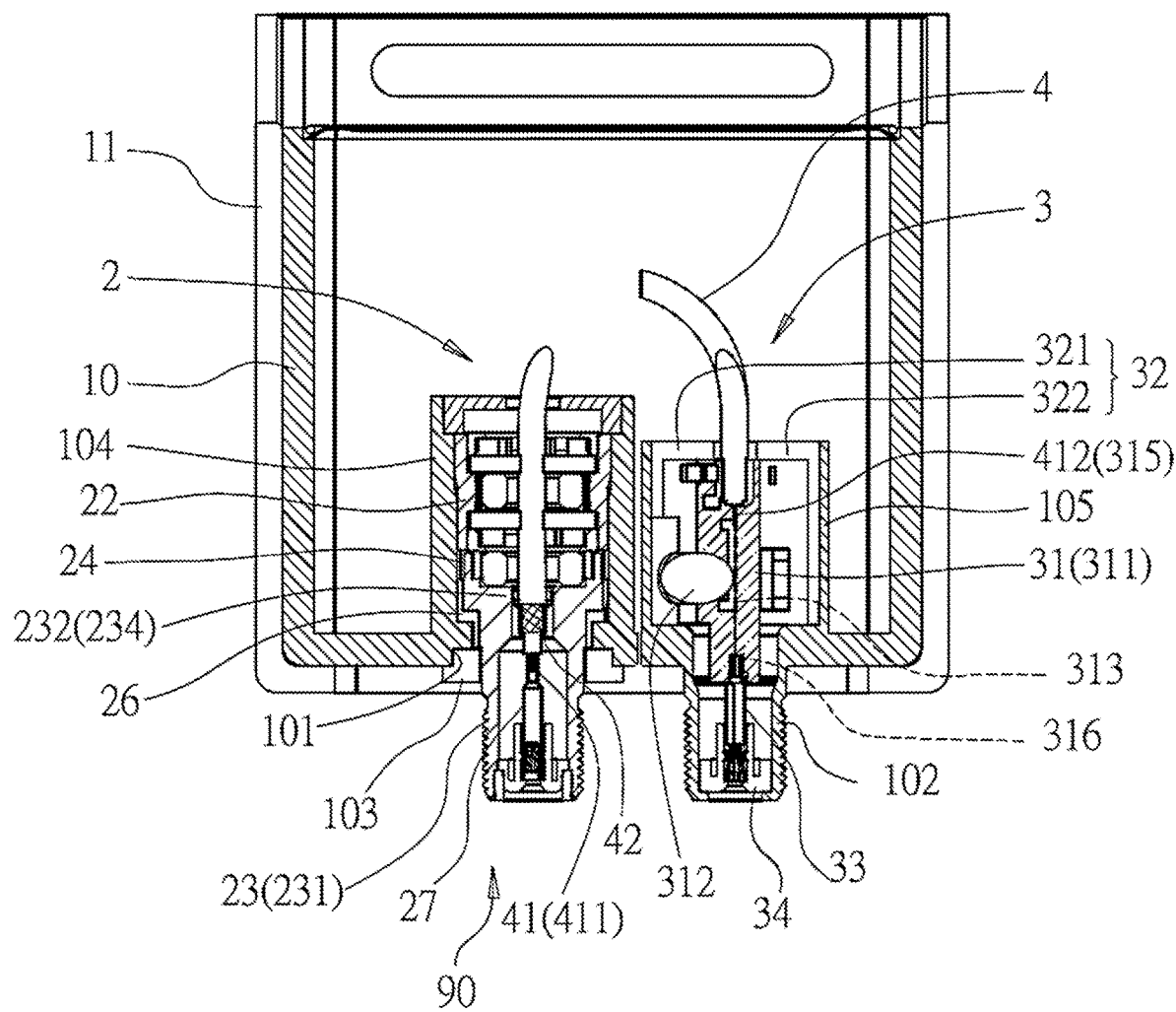
FIG. 5 illustrates a cross-sectional perspective view taken along the line V-V in FIG. 4.

FIG. 3 illustrates a perspective view of a first embodiment of an isolator of the disclosure. FIG. 4 illustrates a front-side view of the first embodiment of the isolator. FIG. 5 illustrates a cross-sectional perspective view taken along the line V-V in FIG. 4. Referring to FIGS. 3 to 5, a first embodiment of an isolator 100 of the disclosure includes a body 10 and an electronic subassembly 90 mounted on the body 10. In some embodiments, the outer surface of the body 10 is covered by an insulating material 11, and the insulating material is selected from plastic, silicon rubber or rubber and so on. The body 10 includes a first connecting port 101, a second connecting port 102, and an insulating bushing 103 disposed on the first connecting port 101. In this embodiment, the body 10 is hollow and further includes a first ring wall 104 and a second ring wall 105. The first ring wall 104 and the second ring wall 105 are connected to the first connecting port 101 and the second connecting port, respectively. The first connecting port 101 and the second connecting port 102 all extend toward the inside of the body 10.

Figure 6:
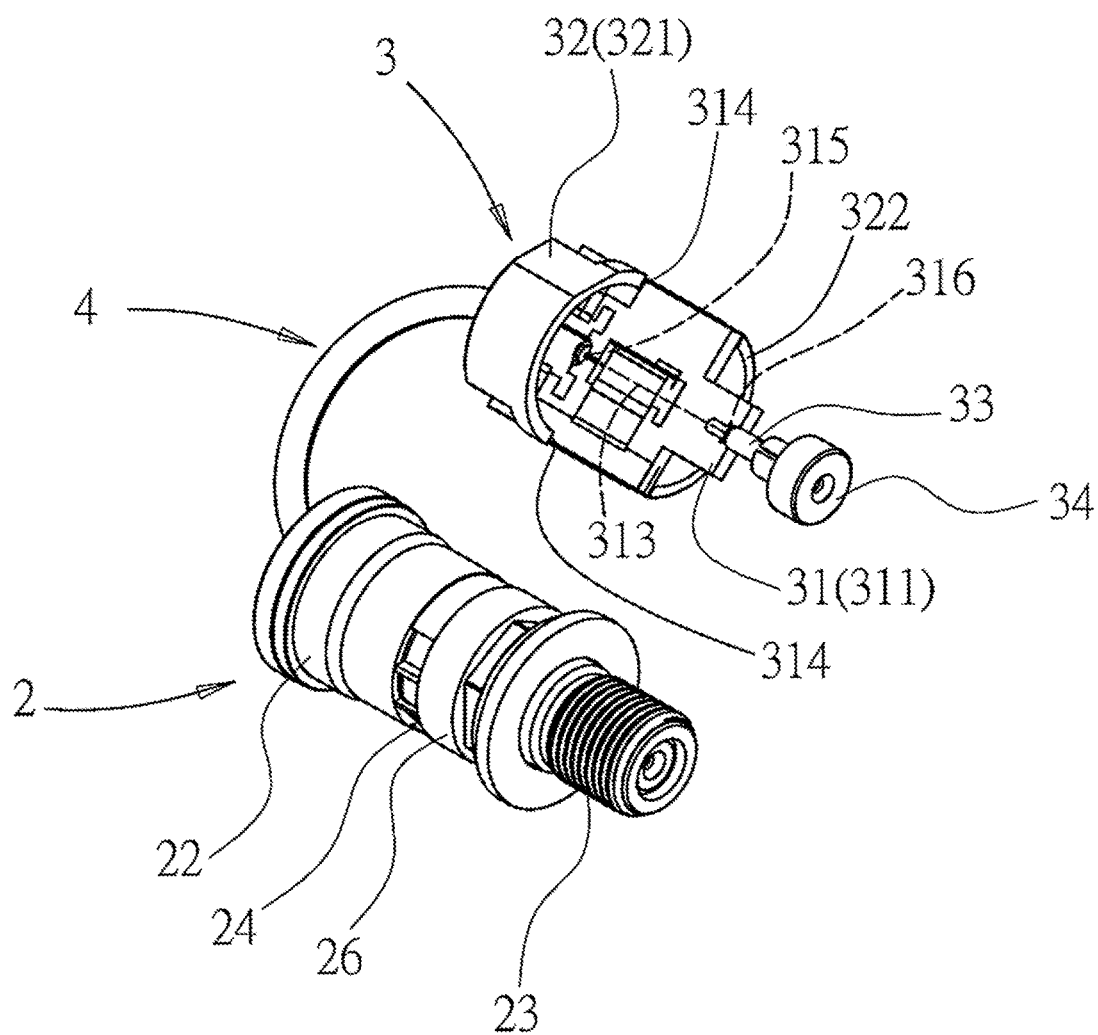
FIG. 6 illustrates a perspective view of an embodiment of an electronic subassembly according to the present disclosure.
Figure 7:
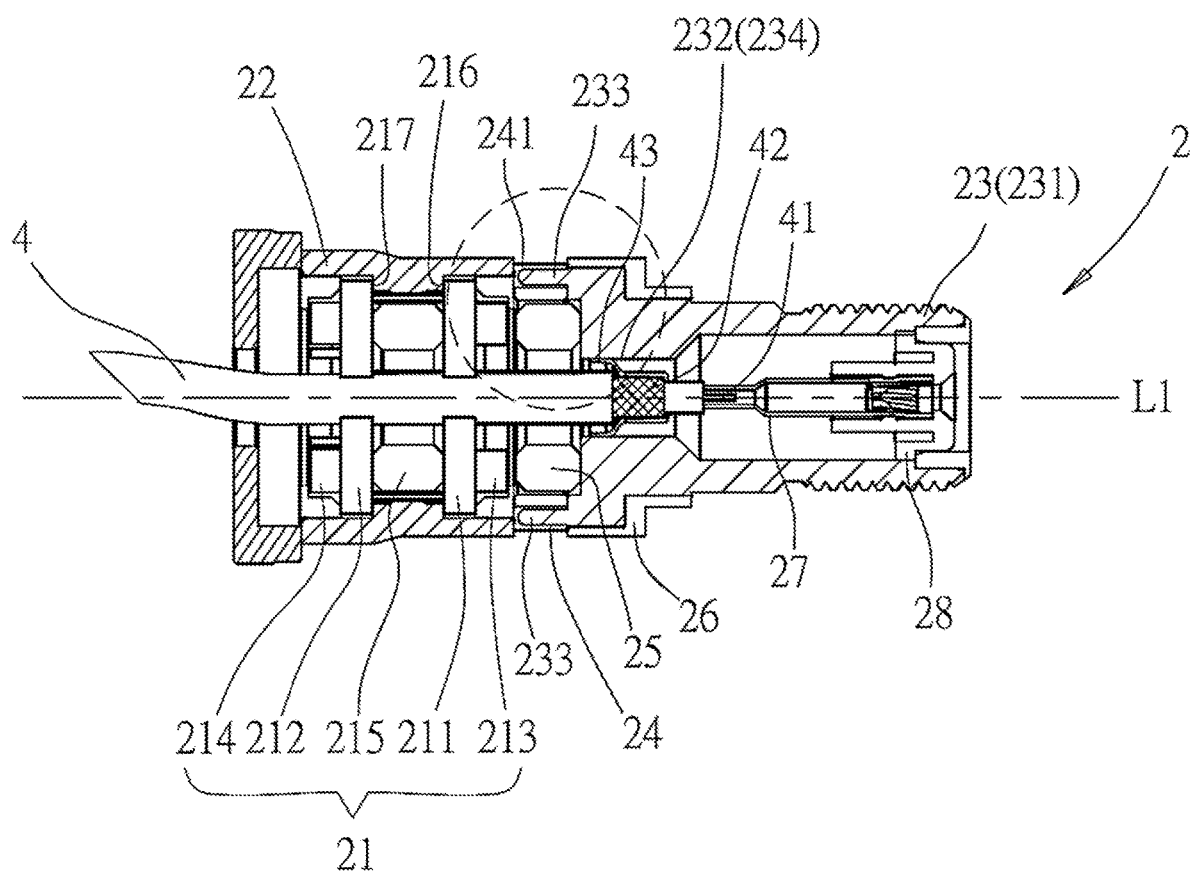
FIG. 7 illustrates a cross-sectional perspective view of a first circuit module of the embodiment of the electronic subassembly.
Figure 8:
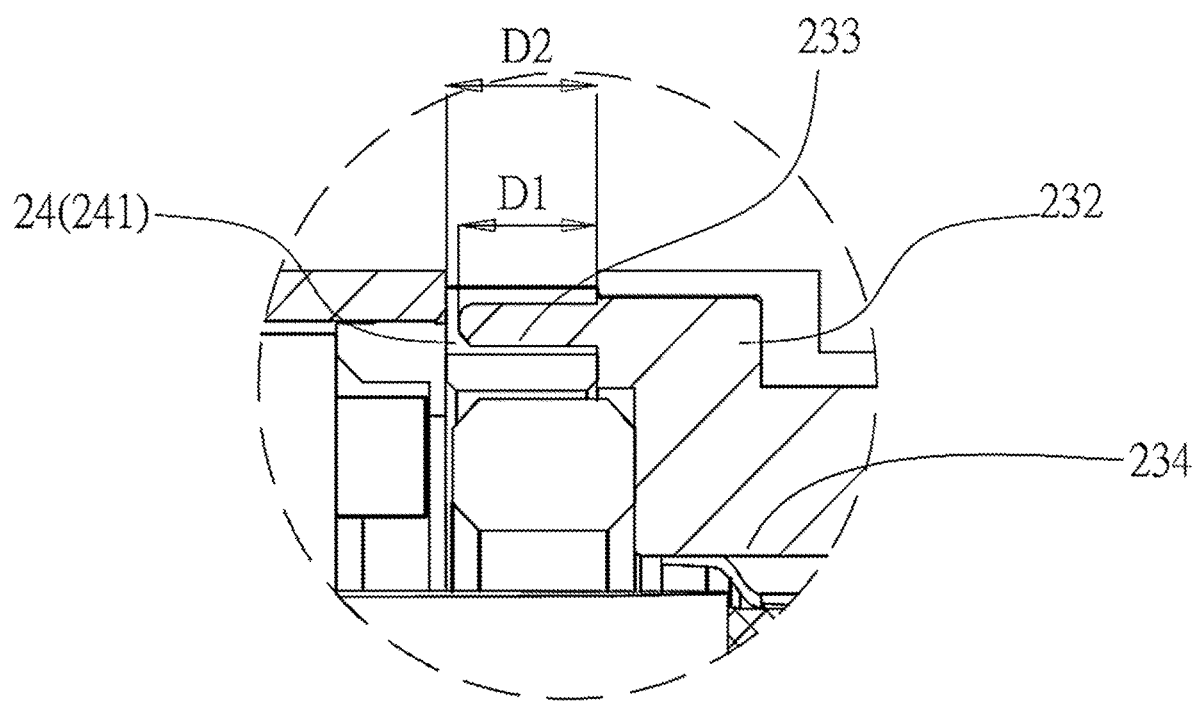
FIG. 8 illustrates a partial-enlarged perspective view from the circle shown in FIG. 7.

FIG. 6 illustrates a perspective view of an embodiment of an electronic subassembly of the disclosure. FIG. 7 illustrates a cross-sectional perspective view of a first circuit module of the embodiment of the electronic subassembly. FIG. 8 illustrates a partial-enlarged perspective view from the circle shown in FIG. 7. Referring to FIGS. 6 to 8, the electronic subassembly 90 includes a first circuit module 2, a second circuit module 3, and a connecting element 4. The first circuit module 2 includes a first integrated circuit board 21, a first shell 22, a joint 23, an insulating ring 24, a first iron core 25, an insulating sleeve 26, a first contact element 27, and a first insulating element 28.

The first integrated circuit board 21 includes a first annular printed circuit board 211 and a second annular printed circuit board 212 both arranged around an axis L1, a plurality of first capacitors 213, a plurality of second capacitors 214, and a second iron core surrounding the axis L1. The first capacitors 213 are evenly distributed on the first annular printed circuit board 211 with the axis L1 as the center of symmetry. Similarly, the second capacitors 214 are evenly distributed on the second annular printed circuit board 212 with the axis L1 as the center of symmetry. In this embodiment, the first capacitors 213 and the second capacitors 214, each of which has a capacitance value of 4700 pF or 5600 pF or 10000 pF, as well as other values, may be of any shape. For example, sheet-shaped. The second iron core 215 is located between the first annular printed circuit board 211 and the second annular printed circuit board 212.

The first shell 22, made of metal, surrounds and contacts the first integrated circuit board 21. The first shell 22 is electrically connected to the ground terminal 216 of the first annular printed circuit board 211. Optionally, the first shell 22 is electrically connected to the ground terminal 217 of the second annular printed circuit board 212 as well.

Referring to FIGS. 5, 7 to 8, the joint 23, made of metal, is sleeved in the insulating bushing 103 of the body 10. The joint 23 has a head section 231, a tail section 232 and two extension parts 233. A portion of the outer peripheral surface of the head section 231 is in close contact with the inner surface of the insulating bushing 103. The tail section 232 has a small diameter part 234 whose inner diameter is smaller than the inner diameter of the head section 231. Each extension part 233 extends outward from the end edge of the tail section 232, and the extension parts 233 are opposite to each other. Each extension part 233 of the joint 23 has a first extension length D1 in the axial direction.

The insulating ring 24 is tightly fitted between the first shell 22 and the joint 23, so that the first shell 22 is not able to directly contact the joint 23. The outer peripheral surface of the insulating ring 24 forms two grooves 241 to accommodate the extension parts 233 of the joint 23. Each groove 241 has a second extension length D2 in the axial direction, and the first extension length D1 is shorter than the second extension length D2 (as shown in FIG. 8). In some embodiments, the joint 23 has only one extension part 233, and only one groove 241 is formed on the outer peripheral surface of the insulating ring 24. As such, the joint 23 and the insulating ring 24 to be embedded together.

The first iron core 25 is sleeved on the insulating ring 24 and surrounds the connecting element 4. The insulating sleeve 26 is sleeved on the tail section 232 of the joint 23, and the outer surface of the insulating sleeve 26 matches the shape of the inner peripheral surface of the first ring wall 104 of the body 10. The joint 23 and the body 10 are electrically isolated by the insulating sleeve 26. Moreover, the shape of the insulating sleeve 26 matches the shape of the first connecting port 101 of the body 10. For example, it may be hexagonal or polygonal, thereby increasing the pairing of multiple planar structures to enhance torsion.

Referring to FIGS. 5 to 6, the second circuit module 3 is disposed adjacent to the second connecting port 102. The second circuit module 3 includes a second integrated circuit board 31, a second shell 32, a second contact element 33, and a second insulating element 34. The second integrated circuit board 31 has a substrate 311 and a lightning protection component 312. A second signal processing circuit 313 is formed on the substrate 311, and two grounding parts 314 are formed on both sides of the second signal processing circuit 313. Each grounding part 314 has two grounding conducting layers, and the grounding conducting layers are positioned on opposite surfaces of the substrate 311. The second signal processing circuit 313 extends along a length direction of the second integrated circuit board 31 and has a first contact point 315 and a second contact point 316. The second contact point 316 of the second signal processing circuit 313 is electrically connected to the second contact element 33. The lightning protection component 312 is electrically connected to the second contact element 33 and the second signal processing circuit 313. The lightning protection component 312 includes one of a protecting tube, a choke and a high pass filter, or is replaced by other circuit designs that may achieve lightning protection.

The second integrated circuit board 31 is not completely surrounded by the second shell 32. In this embodiment, the second shell 32 includes an upper half 321 and a lower half 322, which are arranged correspondingly on the substrate 311. The upper half 321 and the lower half 322 cooperate to sandwich the substrate 311 of the second integrated circuit board 31. The second shell 32 is electrically connected to the grounding parts 314 of the substrate 311 of the second integrated circuit board 31.

Referring to FIGS. 5 to 7, the connecting element 4 is electrically connected to the first integrated circuit board 21 and the second integrated circuit board 31. In this embodiment, the connecting element 4 penetrates through the first integrated circuit board 21. The connecting element 4 has a first signal processing circuit 41 and a grounded circuit 42 inside. A first end portion 411 of the first signal processing circuit 41 of the connecting element 4 is surrounded by a part of the joint 23. The first end portion 411 of the first signal processing circuit 41 is electrically connected to the first contact element 27. A second end portion 412 of the second signal processing circuit 313 is electrically connected to the first contact point 315.

Specifically, in this embodiment, the connecting element 4 is a coaxial cable. The coaxial cable includes a center conductor, an insulating layer, a shielding layer, a braided layer, and a plastic jacket sequentially from the inside to the outside. The material of the center conductor includes copper, iron, silver, nickel, gold, copper-gold alloy, copper-tin alloy, copper-nickel alloy or other polymer, non-metallic conductors with good conductivity and so on. The braided layer includes a metal layer containing aluminum, a metal layer containing copper and a conductive layer containing conductive materials, such as an aluminum foil coating layer or a copper foil coating layer. The braided layer is electrical shielded so that the interference effect may be decreased. The form of the braided layer includes different covering forms such as two-layer weaving (Standard), three-layer weaving (Tri-shield) and four-layer weaving (Quad). In this embodiment, the first signal processing circuit 41 of the connecting element 4 is the central conductor of the coaxial cable, which is used to transmit electrical signals. The grounded circuit 42 of the connecting element 4 is the braided layer of the coaxial cable. It is supplemented that the braided layer of the coaxial cable may be connected to the first annular printed circuit board 211 and the second annular printed circuit board 212 by soldering. Additionally, there is a grounding spring 43 deposited between the coaxial cable and the small diameter part 234 of the joint 23. The grounding spring 43 has one end in contact with the grounded circuit 42 of the connecting element 4 (which is the braided layer of the coaxial cable) and the other end in contact with the small diameter part 234 of the joint 23, so that a good electrical connection is made through the good contact between the small diameter part 234 of the joint 23, the grounding spring 43 and the grounded circuit 42 of the connecting element 4, where the electrical connection is grounded.

Referring to FIGS. 5 to 6, the advantages of the isolator 100 of disclosure are described below through the steps of mounting the electronic subassembly 90 on the body 10:

First, place the first circuit module 2 on the first ring wall 104 of the body 10, and pass the joint 23 through the first connecting port 101 of the body 10, so that the first circuit module 2 is adjacent to the first connecting port 101. The first ring wall 104 is in contact with the first shell 22. The small diameter part 234 of the joint 23 of the first circuit module 2 is electrically connected to the grounded circuit 42 of the connecting element 4. Then plug the insulating bushing 103 into the first connecting port 101 of the joint 23 to prevent the electrical connection between the joint 23 and the body 10. In some embodiments, it may be possible to pre-coat the body 10 with an insulating material to form an insulating portion on the surface in contact with the joint 23. So, even if the insulating bushing 103 is omitted, the joint 23 is insulated from the first connecting port 101 of the body 10 by the insulating portion, preventing electrical connection between the joint 23 and the body 10.

Next, place the second circuit module 3 in the second ring wall 105 of the body 10, the second circuit module 3 is adjacent to the second connecting port 102, after completing the assembly to obtain the isolator 100 of the disclosure.

Figure 9:
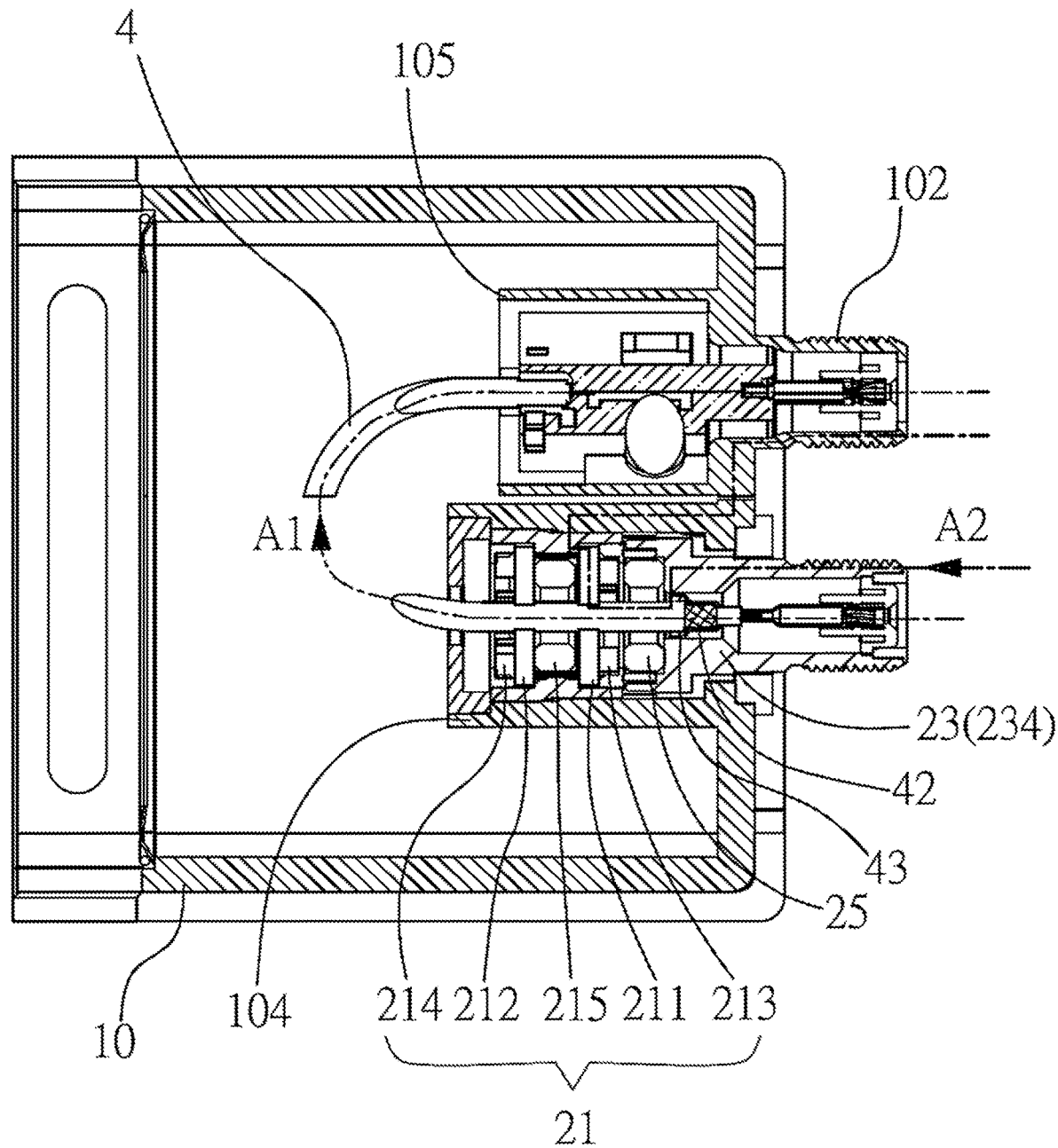
FIG. 9 illustrates a cross-sectional perspective view of FIG. 5 rotated at an angle.

FIG. 5 illustrates a cross-sectional perspective view taken along the line V-V in FIG. 4. FIG. 9 illustrates a cross-sectional perspective view of FIG. 5 rotated at an angle. Referring to FIGS. 5 and 9, in use, the electrical signal transmission path through the isolator 100 of the disclosure is from the first contact element 27, through the first signal processing circuit 41 of the connecting element 4, the second signal processing circuit 313 of the second integrated circuit board 31, and then outward through the second contact element 33 in the second connecting port 102. In FIG. 9, the first arrow A1 indicates the transmission path of the electrical signal. During transmission, the electrical signal passes through the first iron core 25, the second iron core 215 of the first integrated circuit board 21, and the first capacitors 213 and the second capacitors 214, as a result, the abnormal voltage in the transmission process may be removed and the electrical signal in the transmission process may be avoided from being accompanied by abnormal signals. The second integrated circuit board 31 of the isolator 100 contains the lightning protection component 312, which protects against lightning damage.

Further, the route of the second arrow A2 in FIG. 9 indicates an equipotential grounding terminal, which is a grounding circuit that passes through the small diameter part 234 of the joint 23, the grounding spring 43, the grounded circuit 42 (braided layer) of the connecting element 4 (coaxial cable), the ground terminal 216 of the first annular printed circuit board 211 (as shown in FIG. 7), the first shell 22, the first ring wall 104 of the body 10, and the second connecting port of the body 10. The isolator 100 of disclosure has a good grounding effect, thereby ensuring good reception quality.

Figure 10:
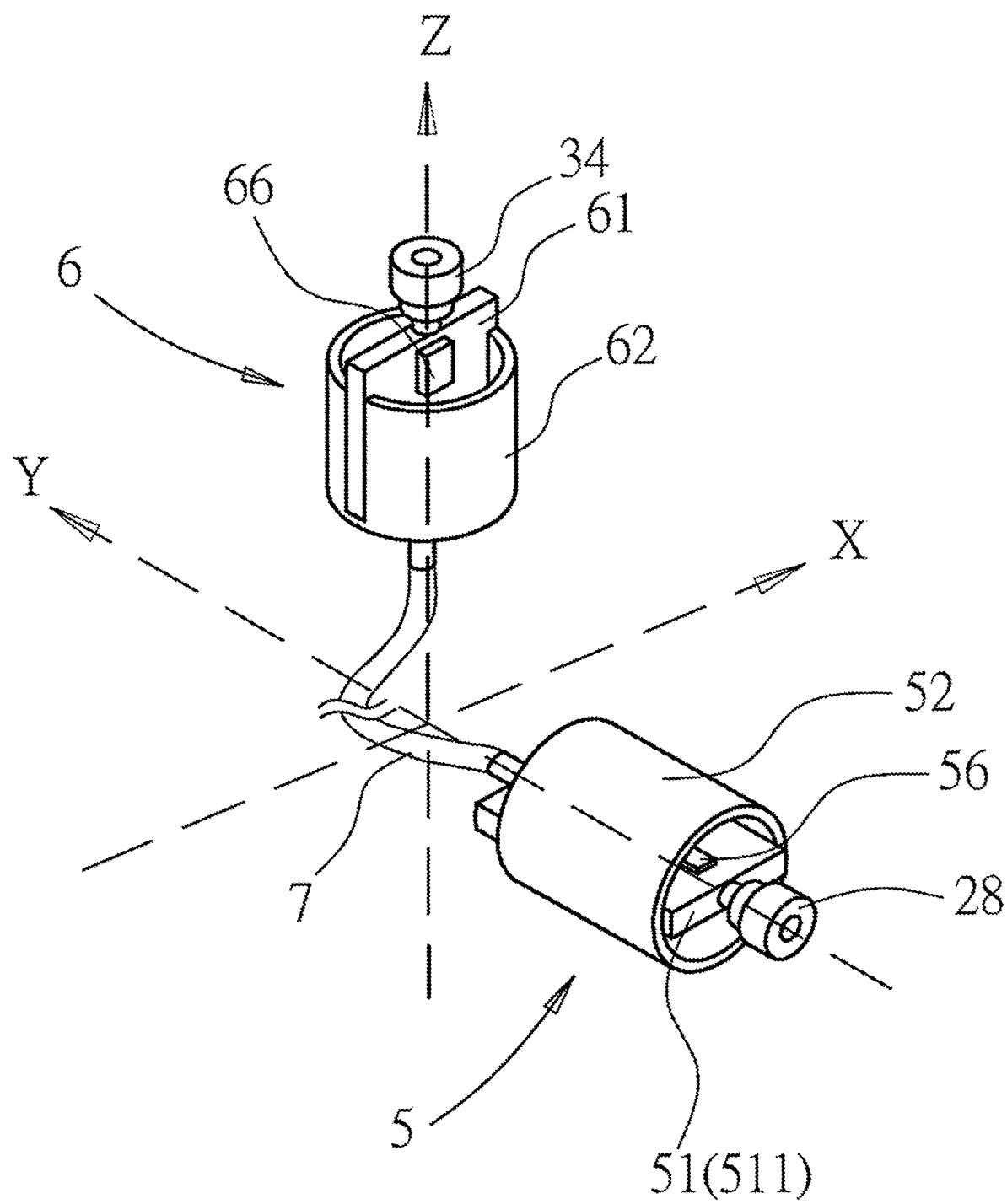
FIG. 10 illustrates a perspective view of a first variation example of the embodiment of the electronic subassembly according to the present disclosure.
Figure 11:
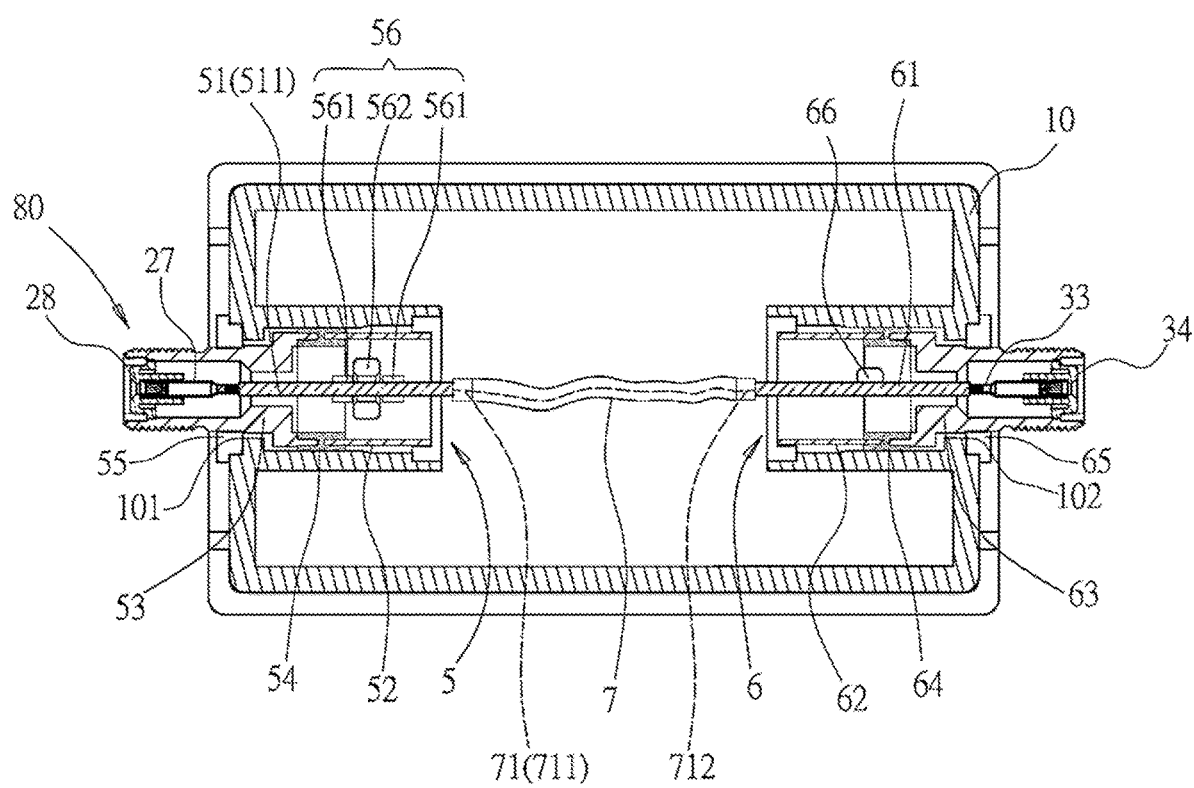
FIG. 11 illustrates a cross-sectional perspective view of the first variation example of the embodiment of the electronic subassembly mounted on a body.

FIG. 10 illustrates a perspective view of a first variation example of the embodiment of the electronic subassembly. FIG. 11 illustrates a cross-sectional perspective view of the first variation example of the embodiment of the electronic subassembly mounted on a body. Referring to FIGS. 10 to 11, a first variant embodiment of the electronic subassembly 80 of the disclosure may also be installed on the body 10 with the first connecting port 101 and the second connecting port 102. The electronic subassembly 80 includes a first circuit module 5, a second circuit module 6 and a connecting element 7.

The first circuit module 5 includes a first integrated circuit board 51, and a first shell 52 surrounding the first integrated circuit board 51. The first integrated circuit board 51 has a substrate 511 and a first functional block 56. The first functional block 56 includes a plurality of capacitors 561 and at least one second iron core 562. The capacitors 561 of the first functional block 56 are arranged on the substrate 511 and symmetrically located on two opposite surfaces of the substrate 511. The second iron core 562 is located between the capacitors 561. The first functional block 56 provides functions of isolating signal noise and lightning protection.

The second circuit module 6 includes a second integrated circuit board 61 and a second shell 62 surrounding the second integrated circuit board 61. The second integrated circuit board 61 has a second functional block 66. The second functional block 66 includes one of a protecting tube, a choke, and a high-pass filter, or other circuit designs that provide lightning protection. In some embodiments, the first functional block 56 and the second functional block 66 may be designed with different functions, one with a signal isolation function and the other with a lightning protection function, or a combination of a signal isolation function and a lightning protection function or other functions, such as signal amplifying function.

The first shell 52 of the first circuit module 5 is connected to the first joint 53 through the first connecting sleeve 54. The first joint 53 passes through the first connecting port 101 of the body 10, and the first insulating bushing 55 is plugged in the first connecting port 101 to prevent electrical conduction between the first joint 53 and the body 10. Similarly, the second shell 62 of the second circuit module 6 is connected to the second joint 63 through the second connecting sleeve 64. The second joint 63 passes through the second connecting port 102 of the body 10, and the second insulating bushing 65 is plugged in the second connecting port 102 to prevent electrical conduction between the second joint 63 and the body 10. The connecting element 7 includes a first signal processing circuit 71 inside. The first signal processing circuit 71 has a first end portion 711 electrically connected to the first integrated circuit board 51, and a second end portion 712 electrically connected to the second integrated circuit board 61. Additionally, the direction in which the first circuit module 5 of the electronic subassembly 80 of the disclosure is installed in the body 10 and the direction in which the second circuit module 6 is installed in the body 10 may be the same but are located on different horizontal planes; or the first circuit module 5 and the second circuit module 6 may be located on the same horizontal plane, but face different installation directions (as shown in FIG. 11). In a free state, the first end portion 711 and the second end portion 712 of the connecting element 7 are opposite. Additionally, the distance between the first circuit module 5 and the second circuit module 6 may be very close, or the first circuit module 5 and the second circuit module 6 may even be separated into different spaces through partitions in the accommodating space defined by the body 10, that is, the shape and internal structure of the body of the disclosure may be designed in various shapes and internal structures depending on the actual application, and there are no limitations.

With the isolator disclosed in FIG. 11, the electrical signal travels from the first contact element 27 in the first connecting port 101 through the first functional block 56 of the first integrated circuit board 51, the connecting element 7, the second functional block 66 of the second integrated circuit board 61, and outward through the second contact element 33 located in the second connecting port 102.

In some embodiments, the connecting element may be a flexible printed circuit board (FPC). The first signal processing circuit is located on the flexible printed circuit board, which has a first end portion and a second end portion that are arranged oppositely. In addition, the connecting element may be, but is not limited to, a wire or a cable.

In some embodiments, when the first functional block on the first integrated circuit board or the second functional block on the second integrated circuit board does not have the signal isolation function, the first circuit module or the second circuit module may even omit the corresponding first shell and the second shell.

Figure 12:
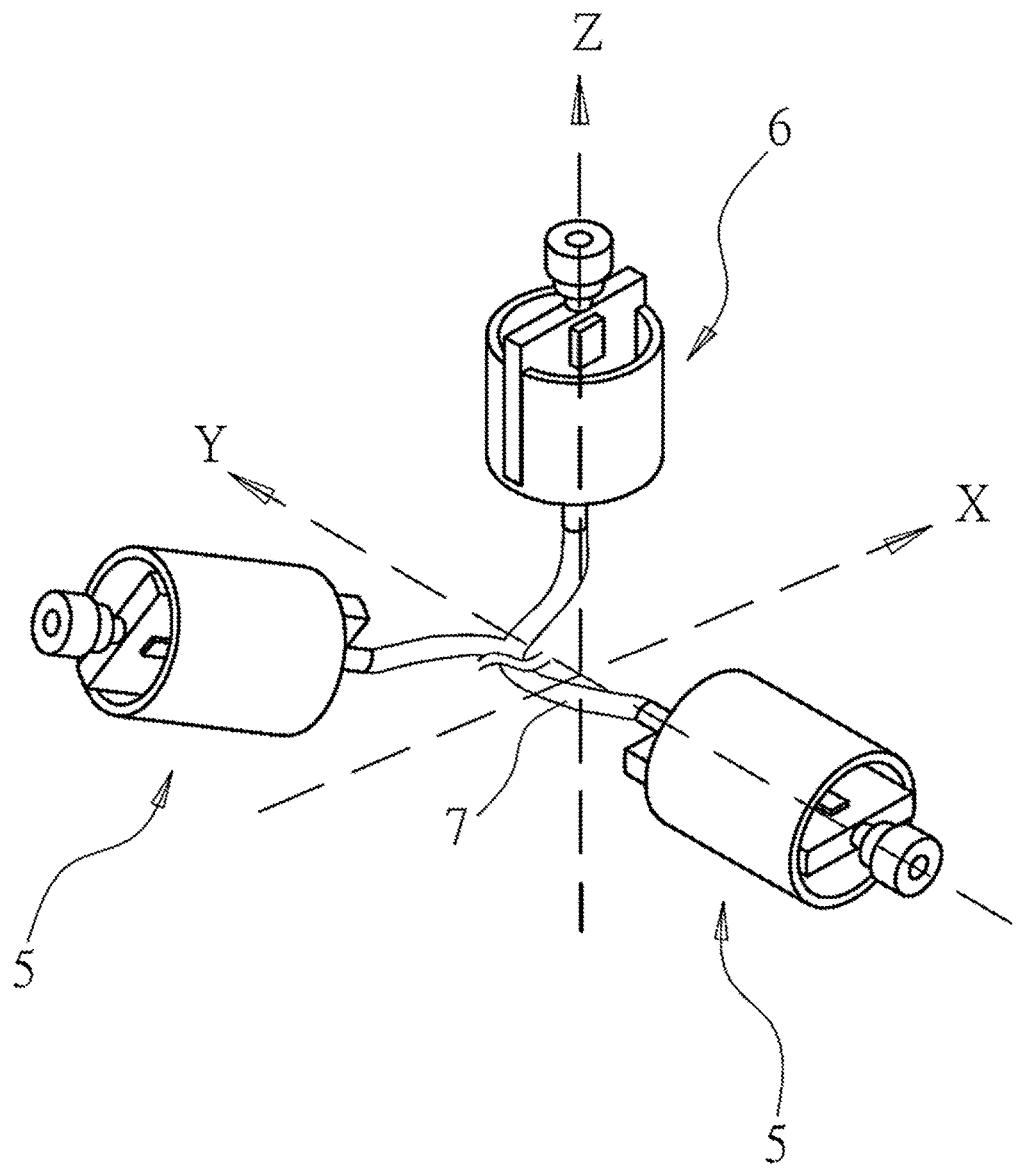
FIG. 12 illustrates a perspective view of a second variation example of the embodiment of the electronic subassembly according to the present disclosure.
Figure 13:
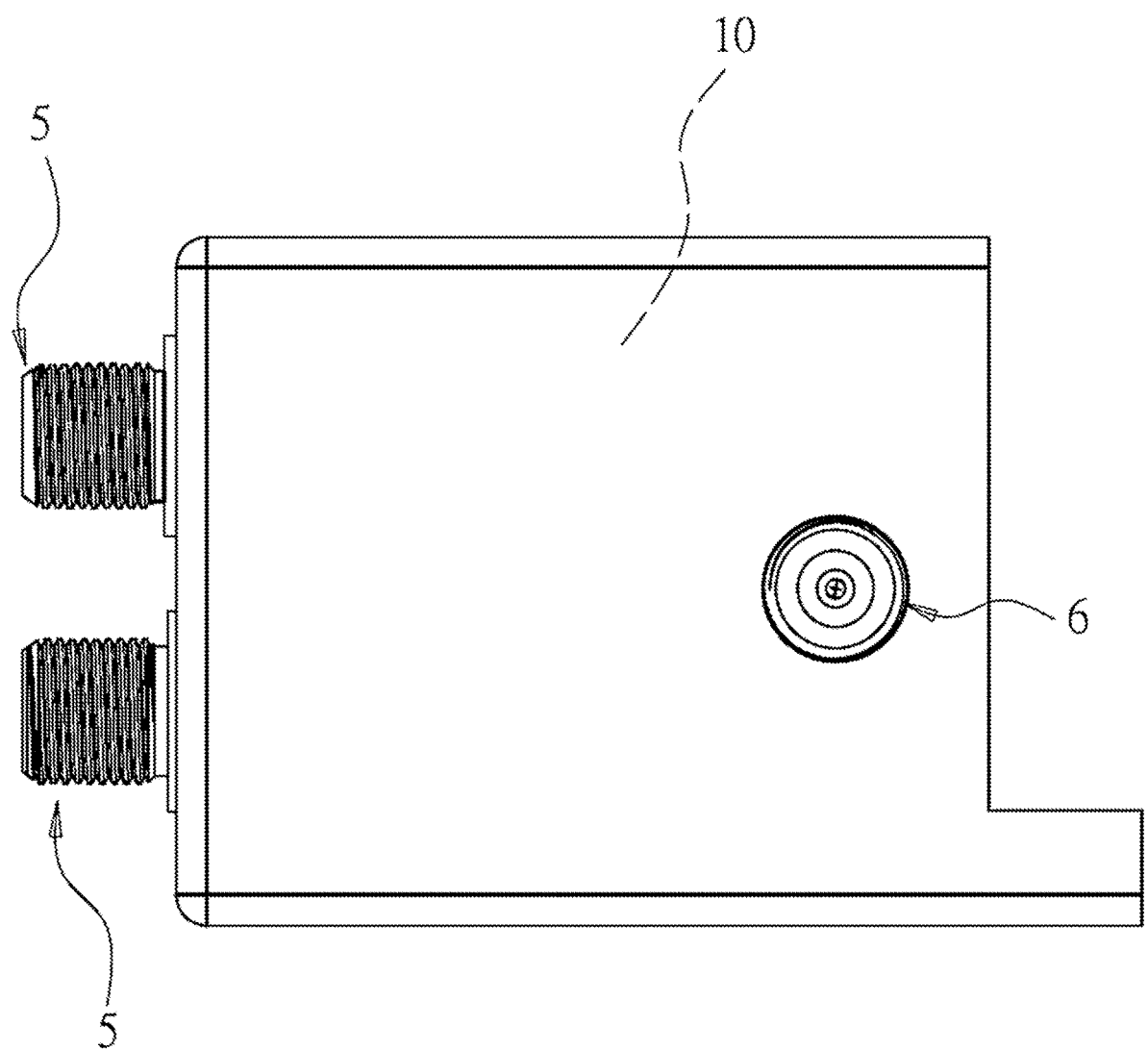
FIG. 13 illustrates a side view of the second variation example of the embodiment of the electronic subassembly mounted on a body.

FIG. 12 illustrates a perspective view of a second variation example of the embodiment of the electronic subassembly. FIG. 13 illustrates a side view of the second variation example of the embodiment of the electronic subassembly mounted on a body. Referring to FIGS. 12 to 13, a second variant embodiment of the electronic subassembly 70 of the disclosure, in terms of quantity, the first circuit module 5 or the second circuit module 6 could be changed. For example, the electronic subassembly 70 further includes one or more first circuit modules 5 or second circuit modules 6. Each first circuit module 5 and each second circuit module 6 are arranged on the body 10 arbitrarily according to application requirements in the XYZ coordinate system.

Through the above description, the advantages of the isolator of the disclosure may be summarized as follows:

(1) The electronic subassembly of the disclosure is suitable for mounting on various shapes of bodies, being very practicable, requiring fewer assembly steps, and requiring a simple and quick installation.

(2) With its compact structure, the electronic subassembly may avoid using a bulky seat body, thereby reducing the overall volume of the isolator, thus overcoming the disadvantages of the conventional signal isolators, which are bulky and space-consuming.

(3) The isolator of the disclosure has a good electrical signal isolation effect and is not only suitable for the frequency band of 0 to 1.8 GHz, but may also be used for higher frequencies.

Figure 14:
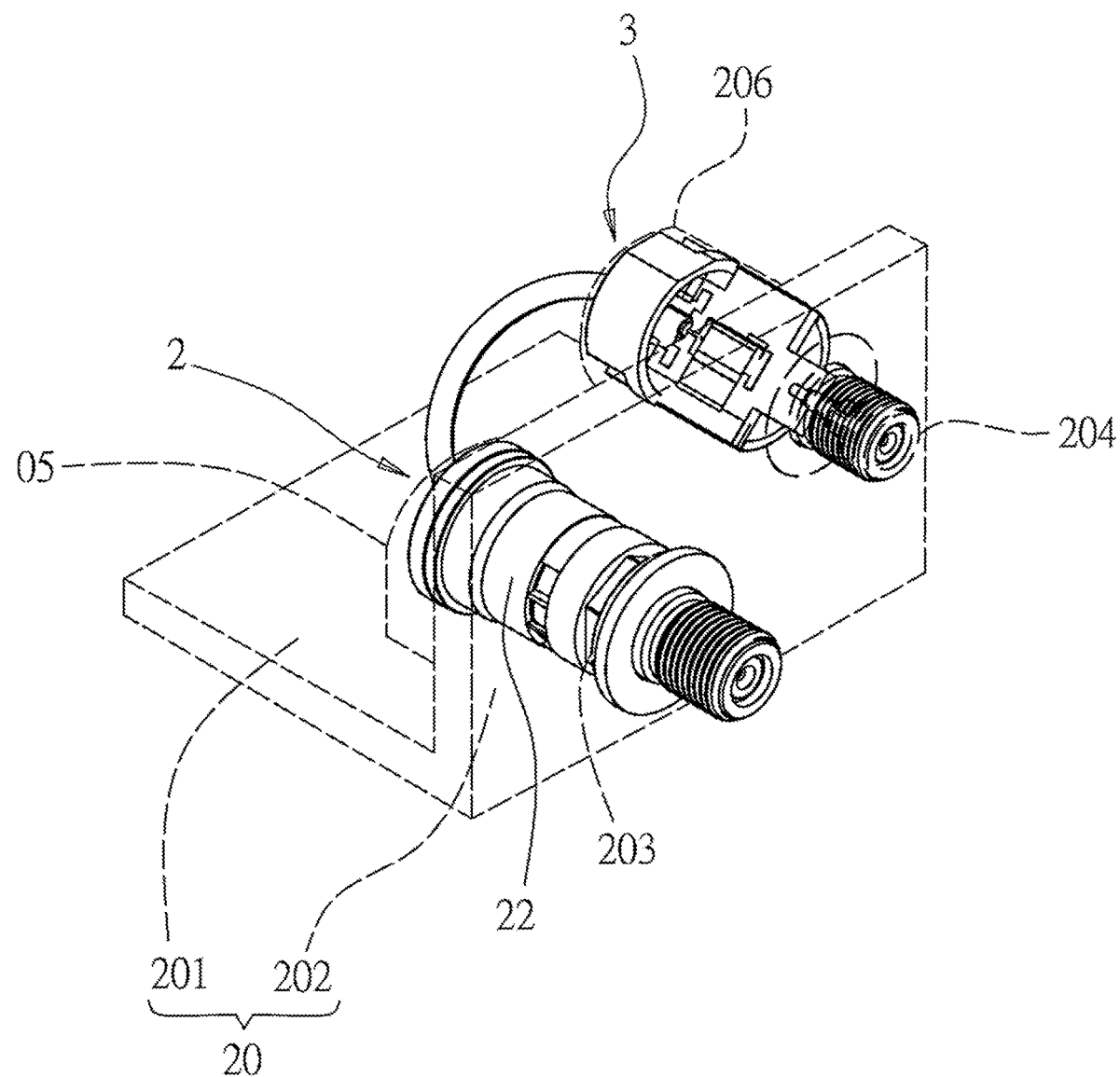
FIG. 14 illustrates a perspective view of a second embodiment of an isolator according to the present disclosure.

FIG. 14 illustrates a perspective view of a second embodiment of an isolator of the disclosure. Referring to FIG. 14, a second embodiment of an isolator 200 of the disclosure is similar to the first embodiment, with the following main differences:

The body 20 is L-shaped and further includes a base wall 201 and a vertical wall 202. The first connecting port 203 and the second connecting port 204 are formed on the vertical wall 202. The body 20 further includes a first ring wall 205 connected to the first connecting port 203, and a second ring wall 206 connected to the second connecting port 204. The first circuit module 2 and the second circuit module 3 are deposited inside the first ring wall 205 and the second ring wall 206, respectively. The base wall 201 is electrically connected to the first shell 22 of the first circuit module 2.

Thus, the second embodiment may also achieve the same effect and purpose as the first embodiment.

Figure 15:
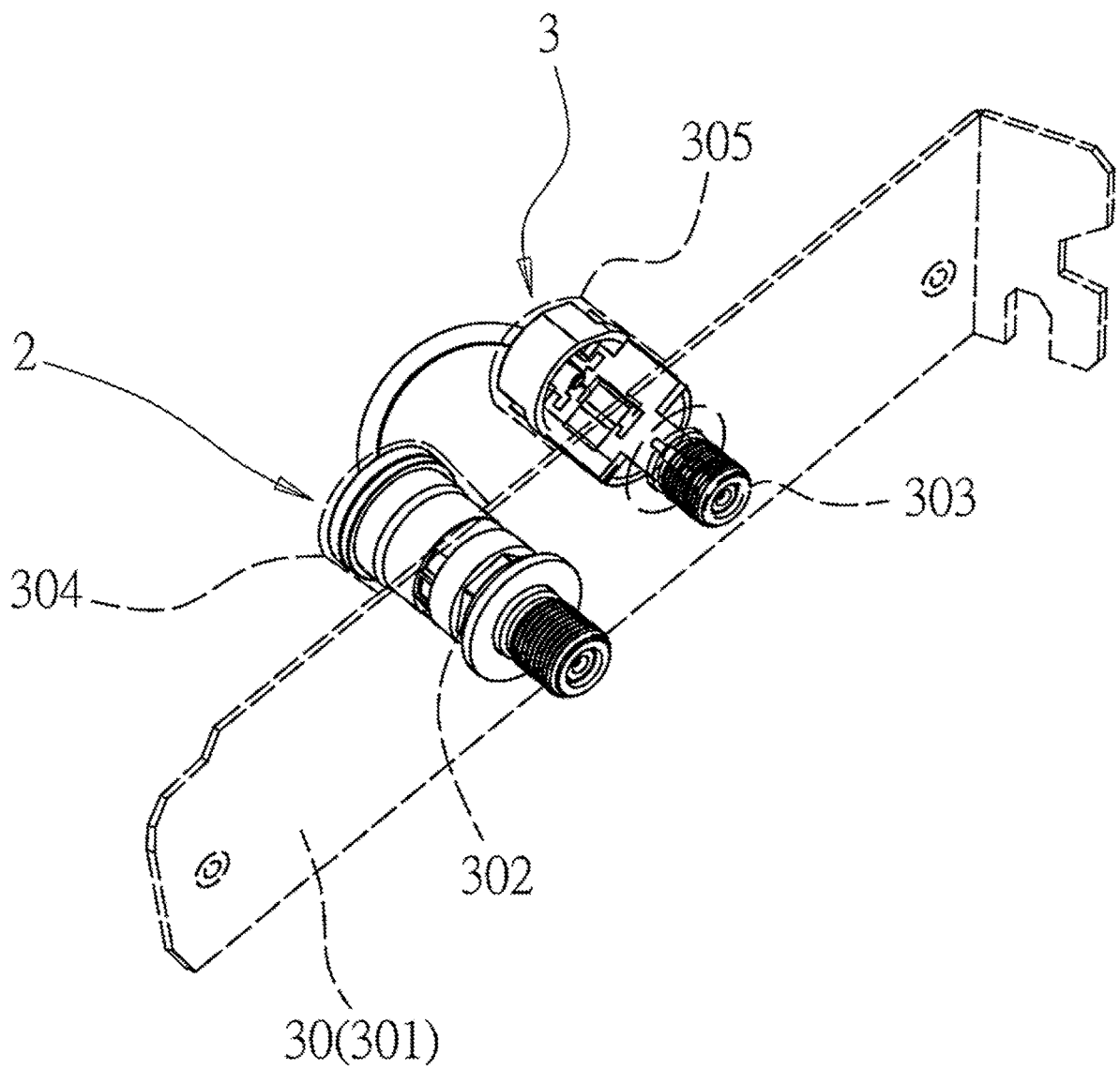
FIG. 15 illustrates a perspective view of a third embodiment of an isolator according to the present disclosure.

FIG. 15 illustrates a perspective view of a third embodiment of an isolator of the disclosure. Referring to FIG. 15, a third embodiment of an isolator 300 of the disclosure is similar to the first embodiment, with the following main differences:

The body 30 is sheet-shaped and further includes a vertical wall 301, a first ring wall 304, and a second ring wall 305. The first connecting port 302 and the second connecting port 303 are formed on the vertical wall 301. The first ring wall 304 extends outward from the first connecting port 302, and the second ring wall 305 extends outward from the second connecting port 303. The first circuit module 2 and the second circuit module 3 are disposed inside the first ring wall 304 and the second ring wall 305, respectively.

Thus, the third embodiment may also achieve the same effect and purpose as the first embodiment.

In summary, using the coaxial design concept, on one end, the isolator's electronic subassembly of the disclosure uses multiple capacitors and iron cores on the first integrated circuit board of the first circuit module to achieve abnormal signal isolation, and on the other end, a lightning protecting tube or other components are used to achieve lightning protection on the second integrated circuit board of the second circuit module. It should be noted that the lightning protecting tube or other components with lightning protection functions need not necessarily be integrated into the second integrated circuit board of the second circuit module, but may be integrated into the first integrated circuit board of the first circuit module as well. The structure of the isolator and its electronic circuit subassembly is exquisite, which effectively reduces the overall volume, thereby achieving the purpose of the disclosure.

Various embodiments of the disclosure may have one or more of the following effects. In some embodiments, the disclosure may provide an isolator and its electronic subassembly with good isolation effectiveness at high frequency. In other embodiments, the disclosure may provide an isolator that may help to solve at least one of the disadvantages of the conventional isolator.

The presently disclosed inventive concepts are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112(f) unless the element or concept is expressly recited using the phrase "means for" or "step for".

Many different arrangements of the various components depicted, as well as components not shown, are possible without departing from the spirit and scope of the present disclosure. Embodiments of the present disclosure have been described with the intent to be illustrative rather than restrictive. Alternative embodiments will become apparent to those skilled in the art that do not depart from its scope. A skilled artisan may develop alternative means of implementing the aforementioned improvements without departing from the scope of the present disclosure.

It will be understood that certain features and subcombinations are of utility and may be employed without reference to other features and subcombinations and are contemplated within the scope of the claims. Unless indicated otherwise, not all steps listed in the various figures need be carried out in the specific order described.

The disclosure claimed is:

1. An isolator comprising a body, a first circuit module, and a second circuit module, wherein:
   the body comprises a first connecting port, a second connecting port, and an insulating bushing arranged on the first connecting port;
   the first circuit module comprises a first integrated circuit board, a first shell surrounding the first integrated circuit board, a first signal processing circuit penetrating the first integrated circuit board, and a joint deposited on the insulating bushing, wherein:
   the first circuit module is arranged adjacent to the first connecting port,
   the joint partially surrounding the first signal processing circuit, and
   a first end portion of the first signal processing circuit being electrically connected to a first contact element; and
   the second circuit module comprises a second integrated circuit board, a second shell surrounding the second integrated circuit board, and a second signal processing circuit extending along a length direction of the second integrated circuit board, wherein:
   the second circuit module is arranged adjacent to the second connecting port, the second signal processing circuit comprises a first contact point and a second contact point,
   the first contact point of the second signal processing circuit is electrically connected to a second end portion of the first signal processing circuit, and
   the second contact point of the second signal processing circuit is electrically connected to a second contact element.

2. The isolator of claim 1, wherein:
   the first circuit module further comprises an insulating ring and a first iron core;
   the insulating ring is deposited between the first shell and the joint;
   the first iron core is sleeved on the insulating ring; and
   the first iron core surrounds the first signal processing circuit.

3. The isolator of claim 2, wherein:
   the joint comprises at least one extension part extending outward from an end edge thereof;
   at least one groove is formed on an outer peripheral surface of the insulating ring to accommodate the at least one extension part of the joint;
   the at least one extension part of the joint comprises a first extension length in an axial direction;
   the at least one groove of the insulating ring comprises a second extension length in the axial direction; and
   the first extension length is shorter than the second extension length.

4. The isolator of claim 1, wherein:
the first integrated circuit board comprises at least one substrate, a plurality of capacitors, and a second iron core;
the capacitors are electrically connected to the at least one substrate;
the capacitors are located symmetrically on both sides of the first signal processing circuit; and
the second iron core surrounds the first signal processing circuit.

5. The isolator of claim 1, wherein:
the second integrated circuit board comprises a substrate and a lightning protection component;
the second signal processing circuit is formed on the substrate; and
the lightning protection component is electrically connected to the second contact element and the second signal processing circuit.

6. The isolator of claim 5, wherein the lightning protection component comprises at least one item selected from the group consisting of a protecting tube, a choke, and a high-pass filter.

7. The isolator of claim 1, wherein:
the first circuit module further comprises a coaxial cable;
the first signal processing circuit is positioned inside the coaxial cable;
the coaxial cable comprises the first end portion and the second end portion; and
the first end portion and the second end portion are oppositely arranged.

8. The isolator of claim 1, wherein:
the first circuit module further comprises a flexible printed circuit board;
the first signal processing circuit is positioned in the flexible printed circuit board;
the flexible printed circuit board comprises the first end portion and the second end portion; and
the first end portion and the second end portion are oppositely arranged.

9. The isolator of claim 1, wherein:
the body is hollow and further comprises a first ring wall extending inward from the first connecting port;
the first ring wall is configured to accommodate the first circuit module; and
the first ring wall connects to the first shell of the first circuit module.

10. The isolator of claim 9, wherein:
the first circuit module further comprises an insulating sleeve;
the joint of the first circuit module comprises a head section and a tail section;
a portion of an outer peripheral surface of head section contacts an inner surface of the insulating bushing;
the insulating sleeve is sleeved on the tail section of the joint; and
a shape of an outer surface of the insulating sleeve matches that of an inner peripheral surface of the first ring wall.

11. The isolator of claim 1, wherein:
the body is L-shaped and further comprises a base wall and a vertical wall; and
the first connecting port and the second connecting port are formed on the vertical wall.

12. The isolator of claim 1, wherein:
the body is sheet-shaped and further comprises a vertical wall, a first ring wall, and a second ring wall;
the first connecting port and the second connecting port are formed on the vertical wall;
the first ring wall extends from the first connecting port;
the second ring wall extends from the second connecting port;
the first circuit module is arranged inside the first ring wall; and
the second circuit module is arranged inside the second ring wall.

13. An electronic subassembly for mounting on a body, comprising a first circuit module, a second circuit module, and a connecting element, wherein:
the body includes a first connecting port and a second connecting port;
the first circuit module comprises a first integrated circuit board and a first shell surrounding the first integrated circuit board, wherein:
the first circuit module is arranged adjacent to the first connecting port, and
the first integrated circuit board comprises a first functional block;
the second circuit module comprises a second integrated circuit board and a second shell surrounding the second integrated circuit board, wherein:
the second circuit module is arranged adjacent to the second connecting port, and
the second integrated circuit board comprises a second functional block; and
the connecting element is electrically connected to the first integrated circuit board and the second integrated circuit board, wherein:
a first contact element is located in the first connecting port to receive an electrical signal,
the electrical signal passes through the first functional block of the first integrated circuit board, the connecting element, and the second functional block of the second integrated circuit board, and
the electrical signal is then transmitted outward through a second contact element located in the second connecting port.

14. The electronic subassembly of claim 13, wherein:
the connecting element penetrates the first integrated circuit board;
the connecting element comprises a first signal processing circuit;
the first signal processing circuit comprises a first end portion electrically connecting to the first contact element;
the second integrated circuit board comprises a second signal processing circuit;
the second signal processing circuit comprises a first contact point and a second contact point;
the first contact point of the second signal processing circuit is electrically connected to a second end portion of the first signal processing circuit; and
the second contact point of the second signal processing circuit is electrically connected to the second contact element.

15. The electronic subassembly of claim 14, wherein:
the body further comprises an insulating portion formed on an inner surface of the first connecting port;
the first circuit module further comprises a joint partially surrounding the first end portion of the connecting element; and
the joint is insulated from the first connecting port of the body by the insulating portion.

16. The electronic subassembly of claim 15, wherein:
the body is hollow and further comprises a first ring wall extending inward from the first connecting port;
the first circuit module is deposited inside the first ring wall;
the connecting element further comprises a grounded circuit;
the first shell of the first circuit module contacts the first ring wall; and
a small diameter part of the joint, the grounded circuit of the connecting element,
a ground terminal on the first integrated circuit board, the first shell, and the first ring wall are electrically connected.

17. The electronic subassembly of claim 13, wherein the connecting element is a coaxial cable.

* * * * *